United States Patent [19]

Nakazato et al.

[11] 4,388,140
[45] Jun. 14, 1983

[54] APPARATUS FOR WET TREATMENT OF WAFER MATERIALS

[75] Inventors: Yasuaki Nakazato, Koshoku; Yasushi Miyazaki, Nagano; Makoto Osuga, Nagano; Masao Kodaira, Nagano, all of Japan

[73] Assignee: Shin-Etsu Chemical Co., Ltd., Tokyo, Japan

[21] Appl. No.: 279,314

[22] Filed: Jul. 1, 1981

[30] Foreign Application Priority Data

Jul. 15, 1980 [JP] Japan ............... 55-99634[U]

[51] Int. Cl.³ .................. B44C 1/22; C03C 15/00; C03C 25/06
[52] U.S. Cl. ..................... 156/345; 156/639
[58] Field of Search ............ 156/639, 662, 345; 134/25.1, 25.5, 33, 65, 132, 137

[56] References Cited

U.S. PATENT DOCUMENTS 3,964,957  6/1976  Walsh ........................ 156/345
4,113,543  9/1978  Salles et al. ................. 156/345

Primary Examiner—William A. Powell
Attorney, Agent, or Firm—Hopgood, Calimafde, Kalil, Blaustein & Judlowe

[57] ABSTRACT

The invention provides a novel apparatus for the wet treatment, e.g. chemical etching treatment, of a plural number of wafer materials such as wafers of high purity silicon semiconductors. The apparatus comprises a liquid tub for containing the treatment liquid, e.g. etching solution, a pair of screw shafts horizontally held in the liquid tub in parallel with each other to be rotatable in the same direction at the same velocity to serve as a kind of screw conveyor and a traveling drum carriage mounted on the screw shafts as engaged with the threads of the shafts at the circular end plates so as to be rotated and transferred in the treatment liquid simultaneously as the screw shafts rotate. The traveling drum carriage holds a wafer basket containing a plural number of the wafer materials perpendicularly to the axis so that the wafer materials are also rotated together with the rotation of the carriage and the surfaces of them are always in contact with the treatment liquid during traveling from one end of the screw shafts to the other.

1 Claim, 5 Drawing Figures

APPARATUS FOR WET TREATMENT OF WAFER MATERIALS

BACKGROUND OF THE INVENTION

The present invention relates to an apparatus for efficient wet treatment of a plural number of wafer materials, e.g. wafers of a silicon semiconductor, with a chemical etching solution or other liquids.

As is well known, wafers of silicon semiconductors are usually subjected to one or more of wet-process treatments such as chemical etching treatment by use of a treatment liquid, e.g. etching solution, in the course of processing into semiconductor devices. In the simplest prior art, such a treatment of chemical etching is carried out by placing the wafer materials one by one in a container such as a basket and by dipping and gently shaking the basket holding the wafers in the treatment liquid, e.g. etching solution. After the end of the chemical etching, the basket is taken out of the etching solution and rinsed in water in a similar manner.

As the number of the wafer materials to be treated in the wet process as described above is increased more and more, such a hand work is no longer practical because not only the hand work is very tedious and inefficient and involves a problem of safety or health of the workers caused by the sometimes toxic treatment liquids but also uniformity or reproducibility cannot be ensured in the effects of the treatment. Accordingly there have been several proposals for the mechanization of the wet-process treatments of wafer materials but none of the machines hitherto proposed can give satisfactory results due to the complicacy in the structure thereof.

SUMMARY OF THE INVENTION

It is therefore an object of the present invention to provide a novel and improved apparatus for the wet-process treatment of wafer materials with a treatment lquid such as an etching solution, with which manual handling of the wafer materials or the basket containing the wafer materials can be minimized.

Another object of the present invention is to provide an apparatus for the wet-process treatment of wafer materials with a treatment liquid, with which uniformity or reproducibility of the effects of the treatment is ensured despite the very simple structure of the apparatus.

The apparatus of the invention for the wet-process treatment of wafer materials with a treatment liquid comprises
(a) a liquid tub for containing at treatment liquid for the treatment of the wafer materials,
(b) a pair of screw shafts threaded in the same pitch and held in the liquid tub in parallel with each other horizontally each in a rotatable manner in the same direction and at the same velocity,
(c) a basket for holding a plural number of the wafer materials, and
(d) a traveling drum carriage for holding the basket therein mounted on the pair of the screw shafts axially in parallel therewith and engaged with the threads of the screw shafts at the end plates of the drum so as to be transferred from one end of the pair of the screw shafts to the other with simultaneous axial rotation by the rotation of the screw shafts.

BRIEF DESCRIPTION OF THE DRAWING

FIG. 1 is a cross sectional view of the inventive apparatus as cut in a vertical plane parallel to the longitudinal direction of the screw shafts.

FIG. 2 is a cross sectional view of the inventive apparatus as cut in a plane perpendicular to the screw shafts.

FIG. 3 is a perspective view of the screw shaft unit of the inventive apparatus as taken out of the liquid tub with a driving pulley above.

DETAILED DESCRIPTION OF THE PREFERRED EMBODIMENTS

Figure 4:
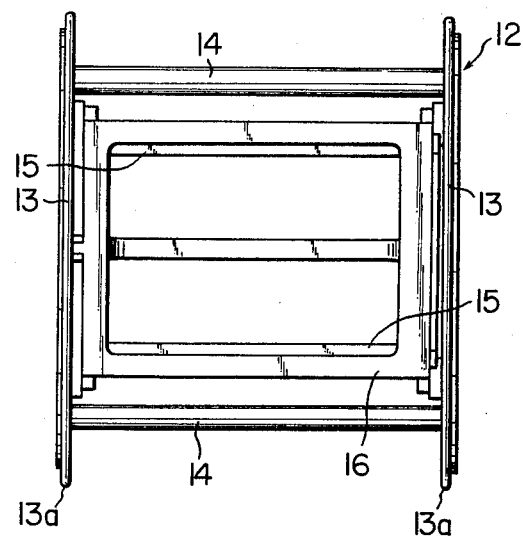
FIG. 4 is a plan view of the traveling drum carriage.

The inventive apparatus is now described in detail with reference to the accompanying drawing illustrating a typical embodiment of the invention.

The liquid tub 1 illustrated in FIGS. 1 and 2 by the cross sections usually has a form of an elongated vat containing the treatment liquid L. The material of the liquid tub 1 is not particularly limitative provided that it has a sufficient mechanical strength and chemical resistance against the attack of the treatment liquid L such as the etching solution contained therein. The length of the liquid tub 1 should be sufficient to ensure that the desired effect of the liquid treatment is obtained during the traveling of the wafer materials from one end of the liquid tub 1 to the other.

Near to the bottom of the liquid tub 1, two screw shafts 2,2 are held as dipped in the treatment liquid L at some distance from each other. They are usually held at the same height in parallel with each other and extend in the longitudinal direction of the liquid tub 1. These screw shafts may be directly supported pivotally by the end walls 1a,1a of the liquid tub 1 but, in consideration of the liquid leakage at the bearings and easiness in the machining, they are preferably supported by a pair of separate bearing stands 3,3 to form a screw shaft unit as shown in FIG. 3 by the perspective view. This screw shaft unit is fixed to the bottom of the liquid tub 1 in a suitable manner.

As is illustrated in FIG. 3, each of the screw shafts 2,2 is provided with a gear 4 at one end protruded out of the bearing stand 3 and the two gears 4,4 are engaged with a common gear 5 which is coaxially fixed to a pivot 6 with a pulley 7 connected to and driven by a motor 8 and a pulley 9 with a driving belt 10. It is readily understood that the screw shafts 2,2 are rotated in the same direction and at the same velocity when the gear ratios of the gears 4,4 are the same and the velocity of rotation thereof can be controlled by selecting the ratio of the diameters of the pulleys 7 and 9. It is of course optional to replace the driving mechanism of the gears and the driving belt with a gear assembly suitable for transmitting the driving power of the motor with an appropriate speed reduction.

The screw shaft unit is built by use of two parallel connecting rods 11,11 at positions higher than the screw shafts 2,2. These connecting rods 11,11 also serve as the guide rails for the undermentioned traveling drum carriage mounted on the screw shafts 2,2.

The above described screw shafts 2,2 serve as a conveyor means for transferring a traveling drum carriage 12 mounted thereon. Therefore the screw pitch of these two screw shafts should be identical in order that the traveling drum carriage 12 can be moved smoothly.

The traveling drum carriage 12 is not necessarily in a form of a so-called drum but may be constructed with two circular end plates 13,13 connected to face each other by use of several tie rods or plates.

Figure 5:
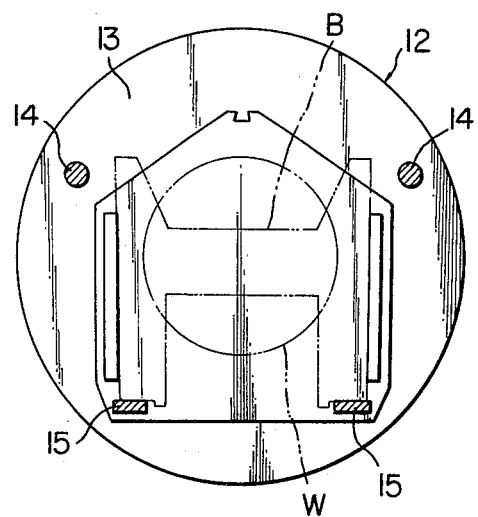
FIG. 5 is a side view of the traveling drum carriage as viewed in the axial direction.

An example of the traveling drum carriage 12 is illustrated in FIGS. 4 and 5 by a plan view and an axial side view, respectively, although this carriage is not limited to the illustrated model since the requirements for the carriage are that the wafer basket and the wafer materials contained therein can be held by the carriage 12 without jolting and traveling of the carriage with simultaneous rotation is ensured by engaging with the threads of the screw shafts 2,2.

As is shown in the figures, the carriage 12 is constructed basically with two circular end plates 13,13 tied together with a pair of tie rods 14,14 and a pair of tie plates 15,15 to face each other coaxially. The periphery 13a of each of the end plates 13,13 is in a form of a flange to facilitate engagement of the end plates 13,13 with the threads of the screw shafts 2,2.

In order to facilitate firm holding of a wafer basket B therein, a frame structure is built in the carriage 12 together with the tie rods 14,14 and tie plates 15,15. As is shown in FIG. 5, the wafer basket B shown by the chain line is rested on the tie plates 15,15 and firmly held at the place by means of a lattice-wise clamping cover 16 shown in FIG. 4 with resilience so that the wafer basket B holding a plurality of wafer materials W perpendicularly to the axis can be rotated together with the carriage 12 without jolting while permitting the treatment liquid L freely contacting with the surfaces of the wafer materials W. The structure of the wafer basket is conventional and need not be described in detail. In short, it is a container which can hold a plurality of wafer materials W in parallel with each other keeping a small distance between adjacent two wafers as is shown in FIG. 1 by the side view. Several types of such wafer baskets are available on the market as specified in JIS (Japanese Industrial Standards) and they can be used as such.

When the wafer materials W are to be subjected to a wet treatment with a treatment liquid L, the traveling drum carriage 12 holding the wafer basket B containing the wafers W is mounted on the screw shafts 2,2 as is shown in FIGS. 1 and 2 so that the flanges 13a,13a of the carriage 12 are engaged with the threads of the screw shafts 2,2. As the screw shafts 2,2 are rotated in the same direction as shown by the arrows in FIG. 2 by means of the driving mechanism, the carriage is also rotated in the direction shown by the arrow in the figure while it travels as guided by the threads of the screw shafts 2,2 from one end thereof to the other. The wafer basket B is rotated as clamped in the traveling drum carriage 12 so that the surfaces of the wafer materials W held in the basket B are always in contact with fresh liquid L such as an etching solution. It is optional that the liquid tub 1 is provided with a means for circulating the treatment liquid L such as an overflow and a pump as combined, if necessary, with a thermostat.

Supposing that the above described treatment with a liquid is chemical etching treatment, it is usual that the wafer materials W after completion of etching are then subjected to succeeding steps of rinsing with water or neutralization. In such a successive process, several of the above described apparatuses as many as the number of the steps are installed in parallel and the traveling drum carriage 12, having arrived at the end of the screw shafts in the first apparatus, e.g. for the etching step, after traveling from the other end, is taken up from the apparatus and then mounted on the screw shafts of the second apparatus, e.g. for rinsing with water, at one end thereof to be transferred to the other end with simultaneous rotation.

As is understood from the above description, the inventive apparatus gives a very efficient means for the wet-process treatment of wafer materials in which a high degree of uniformity is ensured in the effect of the treatment along with a great saving of labor despite the very simple structure of the apparatus. In addition, the inventive apparatus provides a very promising means for full automatization of the whole process of the wet treatment of wafer materials when combined with a robotizing machine for the transfer of the traveling drum carriage from one apparatus to the next.

What is claimed is:
1. An apparatus for the wet treatment of wafer materials with a treatment liquid which comprises
   (a) a liquid tub for containing the treatment liquid,
   (b) a pair of screw shafts threaded in the same pitch and held horizontally in the liquid tub in parallel with each other in a rotatable manner in the same direction at the same velocity,
   (c) a traveling drum carriage having two circular end plates for holding a wafer basket containing a plural number of wafer materials, said carriage being mountable on the pair of the screw shafts axially in parallel therewith and engaged at the end plates with the threads of the screw shafts so as to be transferred from one end of the pair of the screw shafts to the other with simultaneous axial rotation by the rotation of the screw shafts and demountable therefrom, and
   (d) a means for rotating the screw shafts in the same direction.

* * * * *